US011158627B2

(12) United States Patent
Feil et al.

(10) Patent No.: US 11,158,627 B2
(45) Date of Patent: Oct. 26, 2021

(54) ELECTRONIC CIRCUIT WITH A TRANSISTOR DEVICE AND A CLAMPING CIRCUIT

(71) Applicant: Infineon Technologies Austria AG, Villach (AT)

(72) Inventors: Thomas Feil, Villach (AT); Gerhard Noebauer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 99 days.

(21) Appl. No.: 16/388,003

(22) Filed: Apr. 18, 2019

(65) Prior Publication Data
US 2019/0326277 A1  Oct. 24, 2019

(30) Foreign Application Priority Data
Apr. 19, 2018  (EP) .................................... 18168296

(51) Int. Cl.
| H01L 27/02 | (2006.01) |
| H01L 27/06 | (2006.01) |
| H01L 49/02 | (2006.01) |
| H01L 29/06 | (2006.01) |
| H01L 29/08 | (2006.01) |

(Continued)

(52) U.S. Cl.
CPC ...... *H01L 27/0266* (2013.01); *H01L 27/0288* (2013.01); *H01L 27/0629* (2013.01); *H01L 28/20* (2013.01); *H01L 28/60* (2013.01); *H01L 29/0696* (2013.01); *H01L 29/0865* (2013.01); *H01L 29/0882* (2013.01); *H01L 29/1095* (2013.01); *H01L 29/407* (2013.01); *H01L 29/4236* (2013.01); *H01L 29/7397* (2013.01);
(Continued)

(58) Field of Classification Search
CPC ............. H01L 27/0266; H01L 27/0288; H01L 27/0629; H01L 28/20; H01L 28/60; H01L 29/0696; H01L 29/1095; H01L 29/407; H01L 29/4236; H01L 29/7397; H01L 29/7813
See application file for complete search history.

(56) References Cited

U.S. PATENT DOCUMENTS

| 6,181,186 B1 | 1/2001 | Itoh et al. |
| 2013/0168816 A1 | 7/2013 | Kang et al. |

(Continued)

FOREIGN PATENT DOCUMENTS

| EP | 2555241 A1 | 2/2013 |
| JP | H04133512 A | 5/1992 |

(Continued)

*Primary Examiner* — Matthew E. Gordon
(74) *Attorney, Agent, or Firm* — Murphy, Bilak & Homiller, PLLC

(57) ABSTRACT

Disclosed is an electronic circuit. The electronic circuit includes a first transistor device and a clamping circuit. The first transistor device includes a control node and a load path between a first load node and a second load node, and the clamping circuit includes a second transistor device and a drive circuit. The second transistor device includes a control node and a load path connected in parallel with the load path of the first transistor device, and the drive circuit includes a capacitor coupled between the second load node of the first transistor device, and a first resistor coupled between the control node of the second transistor device and a further circuit node.

21 Claims, 13 Drawing Sheets

(51) Int. Cl.
    *H01L 29/10*     (2006.01)
    *H01L 29/40*     (2006.01)
    *H01L 29/423*     (2006.01)
    *H01L 29/739*     (2006.01)
    *H01L 29/78*     (2006.01)
    *H03K 17/081*     (2006.01)

(52) U.S. Cl.
    CPC ... *H01L 29/7813* (2013.01); *H03K 17/08104* (2013.01); *H03K 17/08116* (2013.01)

(56) References Cited

U.S. PATENT DOCUMENTS

| | | | |
|---|---|---|---|
| 2013/0181272 A1* | 7/2013 | Rutter | H01L 29/66666 257/302 |
| 2014/0264577 A1 | 9/2014 | Rieger et al. | |
| 2014/0292287 A1 | 10/2014 | Rutter et al. | |
| 2016/0352318 A1* | 12/2016 | Amit | H02H 7/222 |
| 2018/0019310 A1* | 1/2018 | Hirler | H01L 29/1079 |

FOREIGN PATENT DOCUMENTS

| | | | |
|---|---|---|---|
| JP | 10248237 A | * | 9/1998 |
| JP | H10248237 A | | 9/1998 |
| WO | 9807236 A1 | | 2/1998 |

\* cited by examiner

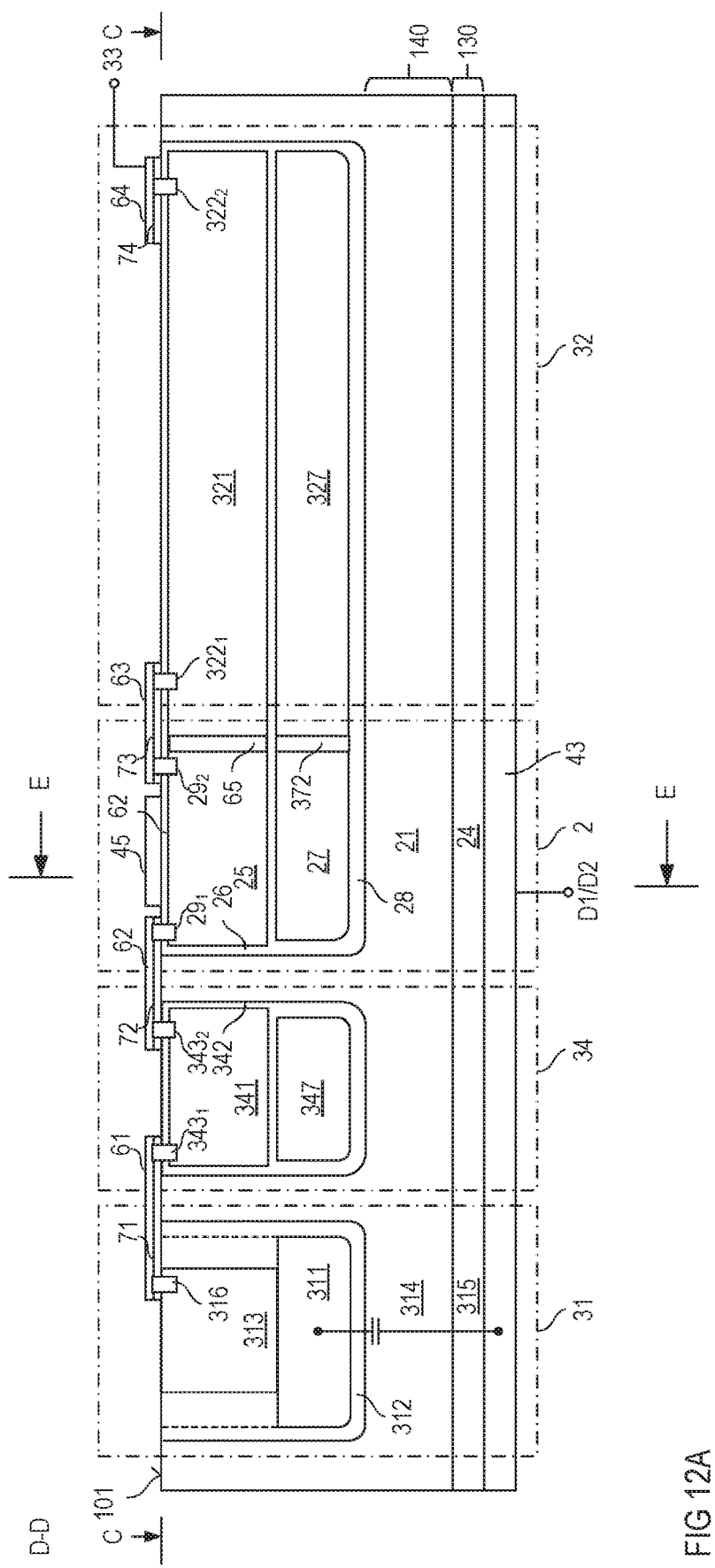

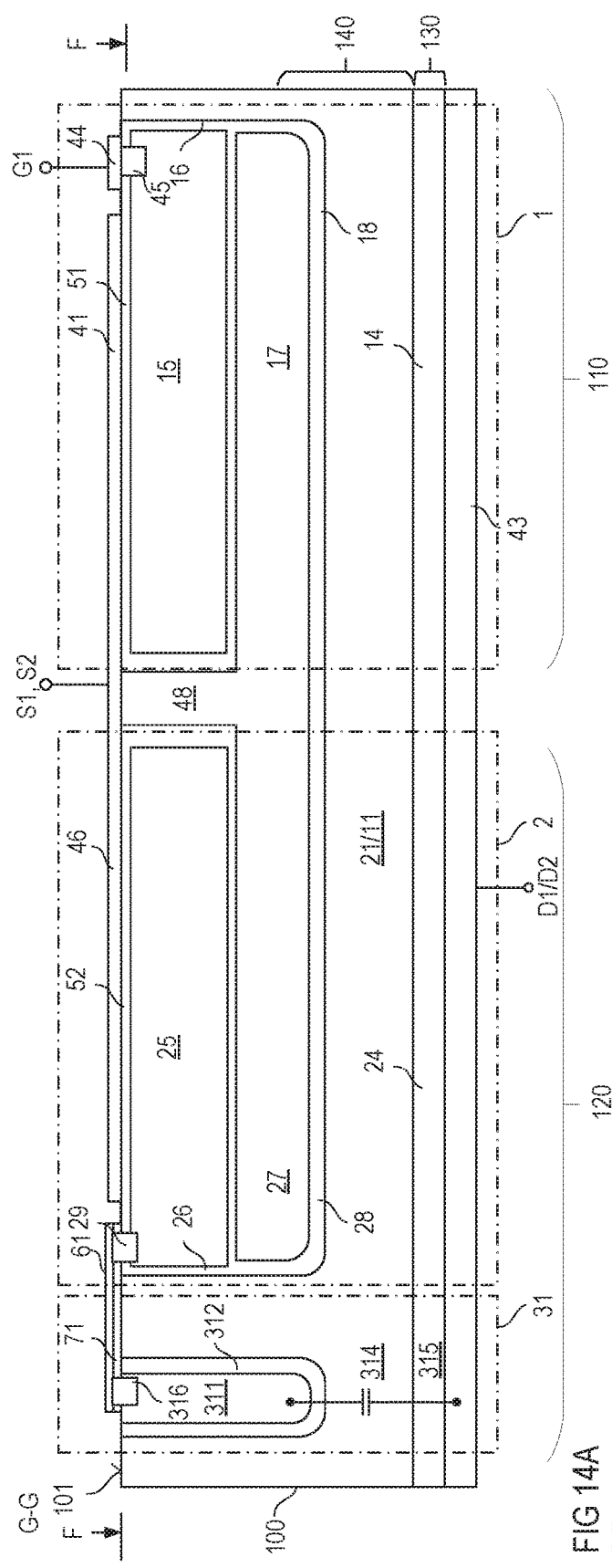
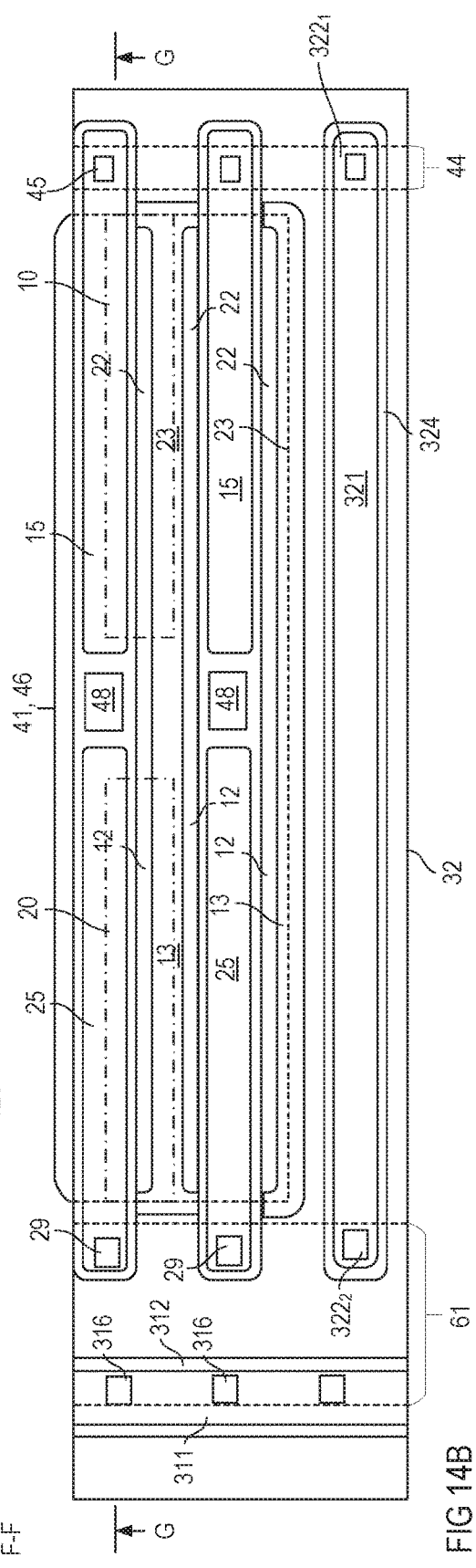
FIG 14A
FIG 14B

ELECTRONIC CIRCUIT WITH A TRANSISTOR DEVICE AND A CLAMPING CIRCUIT

TECHNICAL FIELD

This disclosure in general relates to an electronic circuit with a transistor device.

BACKGROUND

Transistor devices such as insulated gate power transistor devices are widely used as electronic switches in various types of electronic circuits. In a typical application, a load path of the transistor device is connected in series with a load and the transistor device switches on and off dependent on a drive signal received at a drive input. In this type of circuit, a maximum level of a load path voltage across the load path is basically defined by the supply voltage. However, due to parasitic effects voltage spikes of the load path voltage may occur during a transition of the transistor device from an on-state (switched-on state) to an off-state (switched-off state). Such voltage spikes may significantly exceed the supply voltage. Parasitic effects that may cause voltage spikes include, for example, inductances of connection lines between the load path of the transistor device and the load and between the load path of the transistor device and a voltage source providing the supply voltage. The faster the transistor device switches from the on-state to the off-state, the higher these voltage spikes.

Voltage spikes higher than a voltage blocking capability of the transistor device (which is the maximum voltage the transistor device can block) may destroy or degrade the transistor device. The transistor device can be designed such that its voltage blocking capability is higher than the supply voltage and adapted to the voltage spikes that may occur. However, conduction losses and, last but not least, the price of transistor devices increase as the voltage blocking capability increases.

SUMMARY

There is therefore a need to protect a transistor device from voltage spikes that may occur during a transition of the transistor device from one operating state to another operating state, in particular during a transition from the on-state to the off-state.

One example relates to an electronic circuit. The electronic circuit includes a first transistor device and a clamping circuit. The first transistor device includes a control node and a load path between a first load node and a second load node. The clamping circuit includes a second transistor device and a drive circuit, wherein the second transistor device includes a control node and a load path connected in parallel with the load path of the first transistor device, and wherein the drive circuit includes a capacitor coupled between the second load node of the first transistor device, and a first resistor coupled between the control node of the second transistor device and a further circuit node.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

FIGS. 12A-12C illustrate one example of a clamping circuit integrated in a second section of the semiconductor body;

FIGS. 14A-14B illustrate one example of the first transistor device and the clamping circuit integrated in one semiconductor body;

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
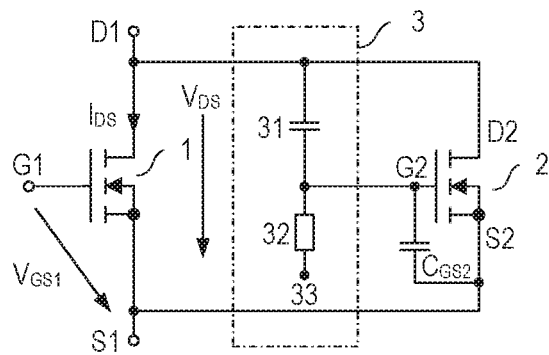
FIG. 1 shows a circuit diagram that illustrates one example of an electronic circuit that includes a first transistor device and a clamping circuit with a second transistor device.

FIG. 1 shows one example of an electronic circuit with a first transistor device 1 and a clamping circuit 2, 3. The first transistor device 1 includes a control node G1 and a load path D1-S1 between a first load node S1 and a second load node D1. The clamping circuit 2, 3 includes a second transistor device 2 and a drive circuit 3. The second transistor device 2 includes a control node G2 and a load path D2-S2, wherein the load path D2-S2 of the second transistor device 2 is connected in parallel with the load path D1-S1 of the first transistor device 1. In the example illustrated in FIG. 1, the load path D2-S2 of the second transistor device 2 is connected in parallel with the load path D1-S1 of the first transistor device 1 in that a first load node S2 of the second transistor device 2 is connected to the first load node S1 of the first transistor device 1 and a second load node D2 of the second transistor device 2 is connected to the second load node D1 of the first transistor device 1. The drive circuit 3 includes a capacitor 31 coupled between the second load node D1 of the first transistor device 1 and a first resistor 32. The first resistor 32 is coupled between the control node G2 of the second transistor device 2 and a further circuit node 33. Examples of the further circuit node 33 are explained herein further below.

According to one example, the first transistor device 1 and the second transistor device 2 are transistor devices of the same type. Just for the purpose of illustration, the first transistor device 1 and the second transistor device 2 are drawn as MOSFETs, in particular, n-type MOSFETs in the example illustrated in FIG. 1. This, however, is only an example. Other types of MOSFETs (Metal Oxide Semiconductor Field-Effect Transistors), or even other types of transistor devices such as, for example, IGBTs (Insulated Gate Bipolar Transistors) or BJTs (Bipolar Junction Transistors) may be used as well to implement the first transistor device 1 and the second transistor device 2. In a MOSFET, the control node is also referred to as gate node, the first load node is also referred to as source node and the second load node is also referred to as drain node. Although the first transistor device 1 and the second transistor device 2 are not restricted to be implemented as MOSFETs, the terms gate node, source node and drain node are used in the following to denote the control nodes G1, G2, the first load nodes S1, S2, and the second load nodes D1, D2 of the first and second transistor device.

The first transistor device 1 is configured to switch on or off dependent on a drive voltage $V_{GS1}$ received at a drive input of the first transistor device 1. This drive voltage is also referred to as gate-source-voltage in the following. In the example illustrated in FIG. 1, the drive input is formed by the gate node G1 and the source node S1 of the first transistor device 1. The first transistor device 1 switches on, when the drive voltage GS has a voltage level that is higher than a threshold voltage of the first transistor device 1 and switches off when the voltage level of the drive voltage $V_{GS1}$ is below the threshold voltage. When the first transistor device 1 is switched on it can conduct a current between the drain node D1 and the source node S1, and when the transistor device 1 is switched off it blocks a current between the drain node D1 and the source node S1, unless a load path voltage $V_{DS}$, which is a voltage between the drain node D1 and the source S1, exceeds the voltage blocking capability of the first transistor device 1. The "voltage blocking capability" defines the maximum load path voltage the first transistor device 1 can withstand. According to one example, the first transistor device 1 is designed such that its voltage blocking capability is between several 10 V and several 100 V. The second transistor device 2 only switches on under certain circumstances that are explained in detail herein further below.

Figure 2A:
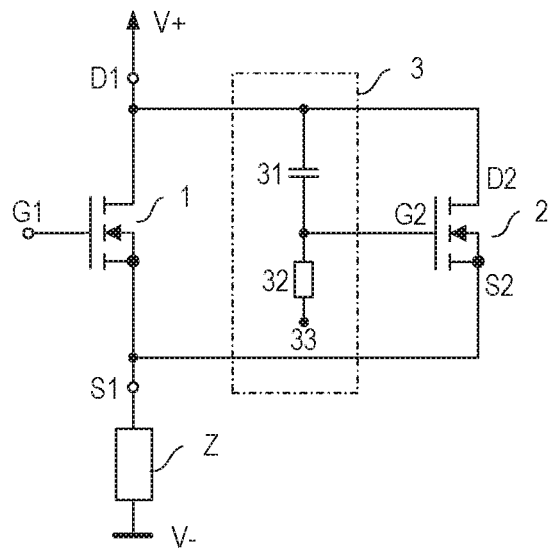
FIGS. 2A-2C show circuit diagrams that illustrate different examples of circuit applications in which an electronic circuit of the type shown in FIG. 1 is used as an electronic switch.
Figure 2B:
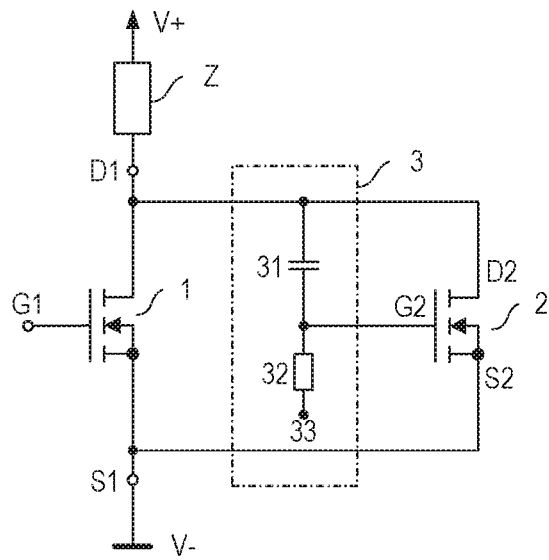
Figure 2C:
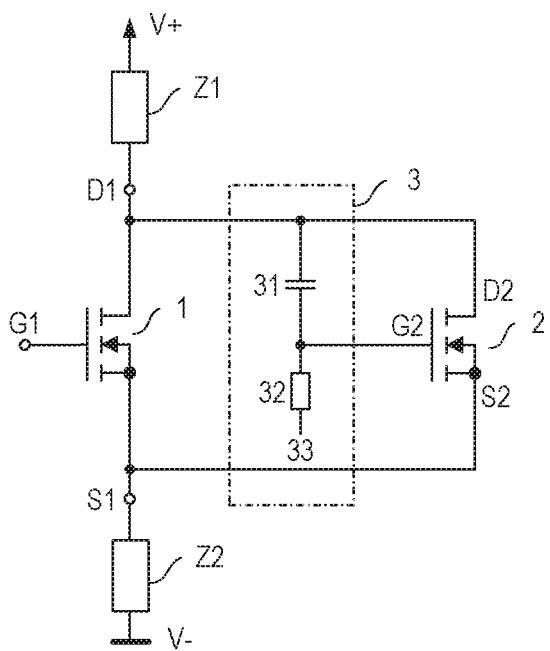

The electronic circuit illustrated in FIG. 1 may be used as an electronic switch in various types of electronic circuits. Some examples of how the electronic circuit may be used as an electronic switch are illustrated in FIGS. 2A to 2C. Referring to FIG. 2A, the electronic circuit may be used as a low-side switch. In this case, the load path D1-S1 of the first transistor device 1 and, therefore, the load path D2-S2 of the second transistor device 2 are connected between a load Z and a circuit node where a negative supply potential or ground potential V− is available. A series circuit with the load path D1-S1 of the first transistor device 1 and the load Z is connected between a circuit node for a positive supply potential V+ and the circuit node for the negative supply potential or ground potential V−.

According to another example illustrated in FIG. 2B, the electronic circuit may be used as a high-side switch. In this example, the load Z is connected between the drain node D1 of the first transistor device 1 and the circuit node for the positive supply potential V+, while the source node S1 of the first transistor device 1 is connected to the circuit node for the negative supply potential or ground potential V−.

According to yet another example, the load path D1-S1 of the electronic circuit is connected between a first load Z1 and a second load Z2, wherein the first load Z1 is connected to the circuit node for the positive supply potential V+ and the second load Z2 is connected to the circuit node for the negative supply potential or ground potential V−.

Referring to FIG. 1, the first resistor 32 is connected between the gate node G2 of the second transistor device 2 and a further circuit node 33. According to one example shown in FIG. 3, the further circuit node 33 is connected to the source node S1 of the first transistor device 1 and the source node S2 of the second transistor device 2.

Figure 3:
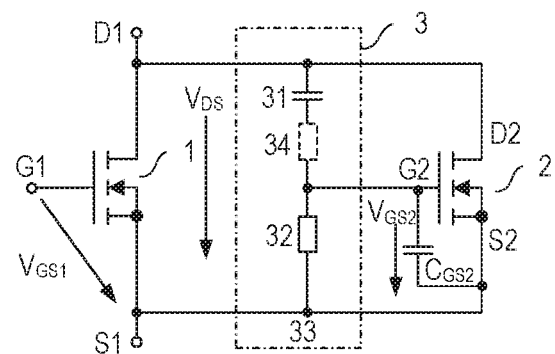
FIG. 3 illustrates one example of the clamping circuit.

The clamping circuit with the second transistor device 2 and the drive circuit 3 protects the first transistor device 1 from overvoltages that may occur after the first transistor device 1 has switched off. In particular, the clamping circuit 2, 3 protects the first transistor device 1 from voltage spikes that may occur due to parasitic effects such as, for example, line inductances of connection lines between the first transistor device 1 and a load or a supply node. The capacitor 31 of the drive circuit 3 and an internal capacitance $C_{GS2}$ of the second transistor device 2 form a capacitor voltage divider between the common drain node D1, D2, and the common source node S1, S2 of the first transistor device 1 and the second transistor device 2. The "common drain node" is the circuit node to which the drain node D1 of the first transistor device 1 and the drain node D2 of the second transistor device 2 are connected to, and the "common source node" is the circuit node to which the source node S1 of the first transistor device 1 and the source node S2 of the second transistor device 2 are connected to. A circuit symbol of this internal capacitance $C_{GS2}$ of the second transistor device 2 is illustrated in FIGS. 1 and 3. The first transistor device 1 includes a similar internal capacitance between the gate node G1 and the source node S1. This internal capacitance of the first transistor device 1, however, is not illustrated in the drawings.

When the first transistor device 1 switches off and the load path voltage $V_{DS}$ increases to a voltage level such that a drive voltage $V_{GS2}$ across the internal capacitance $C_{GS2}$ of the second transistor device 2 reaches a threshold voltage $Vth_2$ of the second transistor device 2 the second transistor device 2 switches on and, therefore, prevents the load path voltage $V_{DS}$ from increasing further. Thus, the second transistor device 2 "clamps" the load path voltage $V_{DS}$ and, therefore, protects the first transistor device 1. A voltage level of the load path voltage $V_{DS}$ that switches on the second transistor device 2 is referred to as clamping level in the following. This clamping level is dependent on the threshold voltage $Vth_2$ of the second transistor device 2 and a voltage divider ratio of the capacitor voltage divider formed by the first capacitor 31 and the internal capacitance $C_{GS2}$ of the second transistor device 2. In general, the second transistor device switches on when its drive voltage $V_{GS2}$ is greater than the threshold voltage $V_{th2}$, that is, $V_{GS2} > V_{th2}$. Further, the drive voltage $V_{GS2}$ is given by $$V_{GS2} = \frac{C31}{C31 + C_{GS2}} \cdot V_{DS}, \quad (1)$$

where C31 is the capacitance value of the first capacitor 31 and $C_{GS2}$ is the capacitance value of the internal capacitor between the gate node G2 and the source node S2 of the second transistor device 2. The capacitance value C31 of the first capacitor 31 is adapted to the capacitance value of the internal capacitance $C_{GS2}$ such that the second transistor device 2 switches on before the load path voltage $V_{DS}$ reaches a voltage level that may damage the first transistor device 1 and such that the drive voltage $V_{GS2}$ of the second transistor device 2 does not reach a critical level that may damage the second transistor device 2. The latter, however, is less critical. The reason is that the transistor device 2 switches on as the drive voltage $V_{GS2}$ reaches the threshold voltage and, therefore, prevents an undue increase of the drive voltage $V_{GS2}$. Equation (1) is an approximation of the drive voltage $V_{GS2}$ of the second transistor device 2. In particular, equation (1) represents the drive voltage GS2 shortly after a rapid increase of the drive voltage $V_{DS}$. In the example illustrated in FIG. 3, the first resistor 32 is connected in parallel with the internal capacitance $C_{GS2}$. This first resistor 32 discharges the internal capacitance $C_{GS2}$ and, therefore, switches off the second transistor device 2 until another rapid increase of the drive voltage $V_{DS}$ again charges the internal capacitance $C_{GS2}$ in order to again switch on the second transistor device 2. Due to the first resistor 32 the second transistor device 2 "automatically" switches off after a certain time period after the second transistor device 2 has been switched on. This time period is dependent on a time constant of an RC element formed by the internal capacitance $C_{GS2}$ and the first resistor 32. In general, the greater a capacitance value of the internal capacitance $C_{GS2}$ and the greater a resistance of the first resistor 32 the longer it takes for the second transistor device 2 to switch off after a voltage spike of the load path voltage $V_{DS}$ has switched on the second transistor device 2.

Switching on the second transistor device 2 includes charging the internal capacitance $C_{GS2}$ of the second transistor device 2, wherein charging the internal capacitance $C_{GS2}$ includes driving a charging current into the internal capacitance $C_{GS2}$ that results from the increasing load path voltage $V_{DS}$. The optional second resistor 34 can be used to limit a current level of this charging current.

Figure 4:
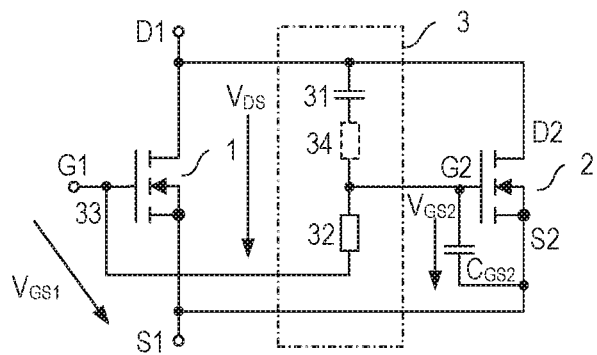
FIG. 4 illustrates another example of the clamping circuit.

FIG. 4 illustrates another example of the clamping circuit. In this example, the further circuit node 33 is connected to the gate node G1 of the first transistor device 1. When the first transistor device 1 is in the off-state, that is, when the drive voltage $V_{GS1}$ is zero, the electrical potential at the further circuit node 33 equals the source potential, which is the electrical potential at the common source node S1, S2. In the off-state of the first transistor device 1, the clamping circuit 2, 3 according to FIG. 4 functions in the same way as the clamping circuit 2, 3 illustrated in FIG. 3. However, the clamping circuit 2, 3 according to FIG. 4 is different from the clamping circuit 2, 3 according to FIG. 3 when the first transistor device 1 is in the on-state. The first transistor device 1 is in the on-state, when the drive voltage $V_{GS1}$ has a voltage level that switches on the first transistor device 1. In the clamping circuit 2, 3 according to FIG. 4, this drive voltage $V_{GS2}$ also switches on the second transistor device 2 so that first transistor device 1 and the second transistor device 2 are in the on-state. An on-resistance, which is the electrical resistance between the common drain node D1, D2 and the common source node S1, s2 is therefore lower in the electronic circuit according to FIG. 4 than in the electronic circuit according to FIG. 3.

Figure 5:
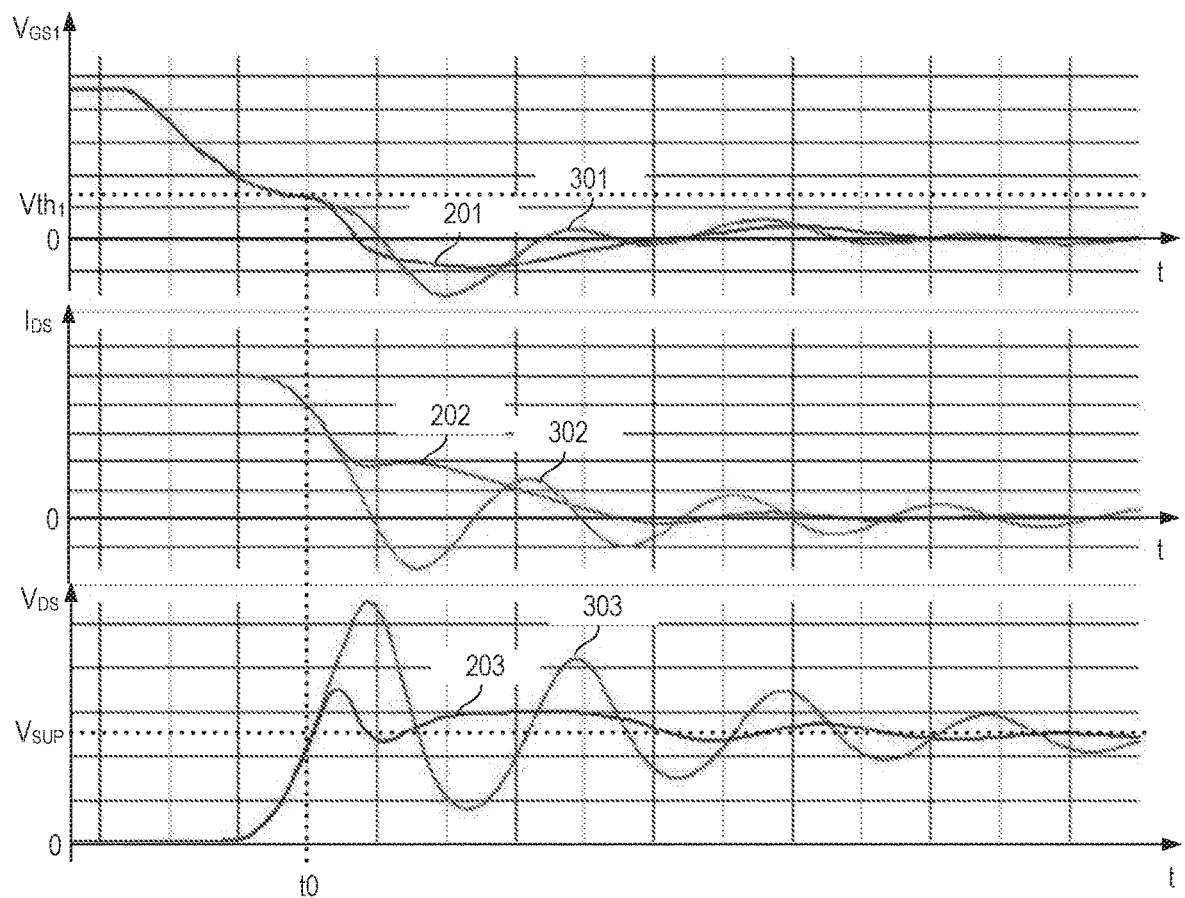
FIG. 5 shows signal waveforms of a drive voltage, a load path voltage, and a load current of the first transistor device in an electronic circuit of the type shown in FIG. 1 and of a transistor device not coupled to a clamping circuit.

FIG. 5 shows signal diagrams that illustrate the function of the clamping circuit 2, 3. In particular, FIG. 5 shows signal diagrams of the drive voltage $V_{GS1}$ of the first transistor device 1 (see curve 201), the load current IDS flowing through the first transistor device 1 (see curve 202), and the load path voltage $V_{DS}$ (see curve 203) across the load paths D1-S1, D2-S2 of the transistor devices 1, 2. For comparison reasons, curve 301 shows the drive voltage $V_{GS1}$ when the clamping circuit 2, 3 is omitted, curve 302 shows the load current IDS when the clamping circuit 2, 3 is omitted, and curve 303 shows the load path voltage of the first transistor device when the clamping circuit 2, 3 is omitted. Referring to FIG. 5, in each case, the load path voltage $V_{DS}$ increases and the load current IDS decreases when the drive voltage $V_{GS1}$ falls below the threshold voltage $Vth_1$. In FIG. 5, t0 denotes the time when the drive voltage $V_{GS1}$ falls below the threshold voltage $Vth_1$. Referring to curves 301-303, in a first transistor device 1 not connected to a clamping circuit oscillations of the load path voltage $V_{DS}$ and corresponding oscillations of the load current IDS may occur, wherein a peak voltage of the oscillation of the load path voltage $V_{DS}$ can be significantly higher than a supply voltage $V_{SUP}$. In the applications illustrated in FIGS. 2A to 2C, for example, the supply voltage is the voltage between the circuit node for the positive supply potential V+ and the circuit node for the negative supply potential V−. Referring to curves 201-203, in the electronic circuit with the clamping circuit 2, 3 the clamping circuit 2, 3 clamps the load path voltage $V_{DS}$ such that a maximum level of the load path voltage $V_{DS}$ is significantly lower than in the scenario in which the clamping circuit is omitted. In particular, this can be seen by comparing curves 203 and 303 in FIG. 5. Not only that the clamping circuit 2, 3 clamps the load path voltage $V_{DS}$, it also dampens oscillations of the load path voltage $V_{DS}$ and the drive voltage IDS more rapidly. These oscillations may result from parasitic elements that are connected to the transistor device 1 or that are part of the transistor device 1. Such parasitic elements include, but are not restricted to, line inductances of connection lines between the transistor device 1 and the load Z, or a drain-source capacitance of the transistor device 1, which is a capacitance between the drain node D and the source node S.

Figure 6:
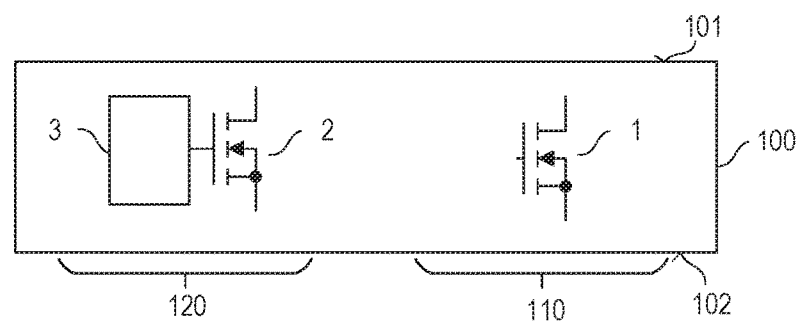
FIG. 6 schematically illustrates a semiconductor body in which the electronic circuit may be implemented.

According to one example, the first transistor device 1, the second transistor device 2 and the drive circuit 3 are integrated in one and the same semiconductor body 100. FIG. 6 schematically illustrates the semiconductor body 100 in which the first transistor device 1, the second transistor device 2 and the drive circuit 3 are integrated. This semiconductor body 100 includes a first surface 101 and a second surface 102 opposite the first surface 101. Further, the semiconductor body 100 includes a first region 110 in which the first transistor device 1 is integrated and the second region 120 in which the second transistor device 2 and the drive circuit 3 are integrated.

Figure 7:
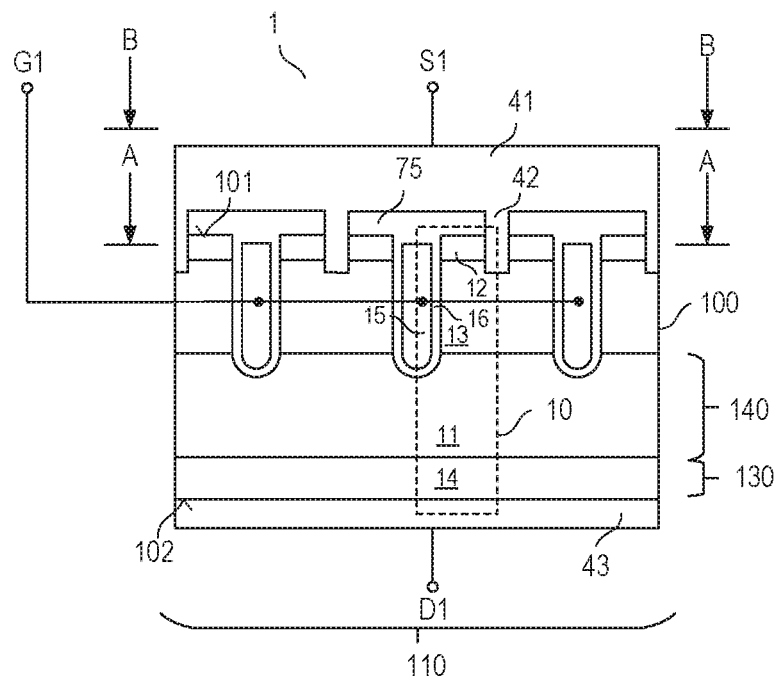
FIG. 7 illustrates one example of the first transistor device integrated in a first section of the semiconductor body.

The first transistor device 1 can be implemented in various ways. One example of the first transistor device 1 is illustrated in FIG. 7, which shows a vertical cross sectional view of the first region 110 in which the first transistor device is integrated. Referring to FIG. 7, the first transistor device 1 includes a plurality of transistor cells 10. Each of these transistor cells includes a drift region 11, a source region 12 separated from the drift region 11 by a body region 13, and a drain region 14. The drain region 14 is spaced apart from the body region 13 and separated from the body region 13 by the drift region 11. Referring to FIG. 7, each transistor cell 10 further includes a gate electrode 15 that is adjacent the body region 13 and dielectrically insulated from the body region 13 by a gate dielectric 16. The source regions 12 and body regions 13 of the individual transistor cells 10 are electrically (ohmically) connected to a source electrode 41. This source electrode 41 forms the source node S1 or is electrically connected to the source node S1 of the first transistor device 1. The source electrode 41 may include contact plugs 42 that extend through an insulation layer 75 on top of the first surface 101 to the source and body regions 12, 13 of the individual transistor cells 10. In the example illustrated in FIG. 7, the gate electrodes 15 are located in trenches extending from the first surface 101 into the semiconductor body 100. This, however, is only an example. According to another example (not shown), the gate electrodes 15 are implemented as planar electrodes on top of the first surface 101 of the semiconductor body 100. The gate electrodes 15 are connected to the gate node G1 of the first transistor device 1. A connection between the gate electrodes 15 and the gate node G1 is only schematically illustrated in FIG. 7.

Referring to FIG. 7, the drain region 14 of the first transistor device is connected to the drain node D1. A metallization layer 43 may be formed on the second surface 102 and adjoin the drain region 14. This optional metallization layer 43 may form the drain node D1 or may be connected to the drain node D1.

Referring to FIG. 7, the plurality of transistor cells 10 may have the drift region 11 and the drain region 14 in common. Further, two or more transistor cells may share one gate electrode 15 and two or more transistor cells may share one body region 13. The source region 12 and the drift region 11 have the same doping type and the body region 13 has a doping type complementary to the first doping type. In an n-type MOSFET, the source region 12 and the drift region 11 are n-doped regions while the body region 13 is a p-doped region. In a p-type MOSFET, the doping types of the individual device regions are complementary to the doping type of the corresponding device regions in an n-type MOSFET. In a MOSFET, the drain region 14 has the same doping type as the drift region 11 and the source region 12. The first transistor device 1 could also be implemented as an IGBT. In this case, the drain region 14 has a doping type that is complementary to the doping type of the drift region 11 and the source region 12. The transistor device can be implemented as an enhancement (normally-off) device. In this case, the body region 13 adjoins the gate dielectric 16. Alternatively, the first transistor device 1 can be implemented as a depletion (normally-on) device. In this case, a channel region (not shown in the drawings) of the same doping type as the source region 12 and the drift region 11 extends from the source region 12 to the drift region 11 along the gate dielectric 16 and separates the body region 13 from the gate dielectric 16.

Figure 8:
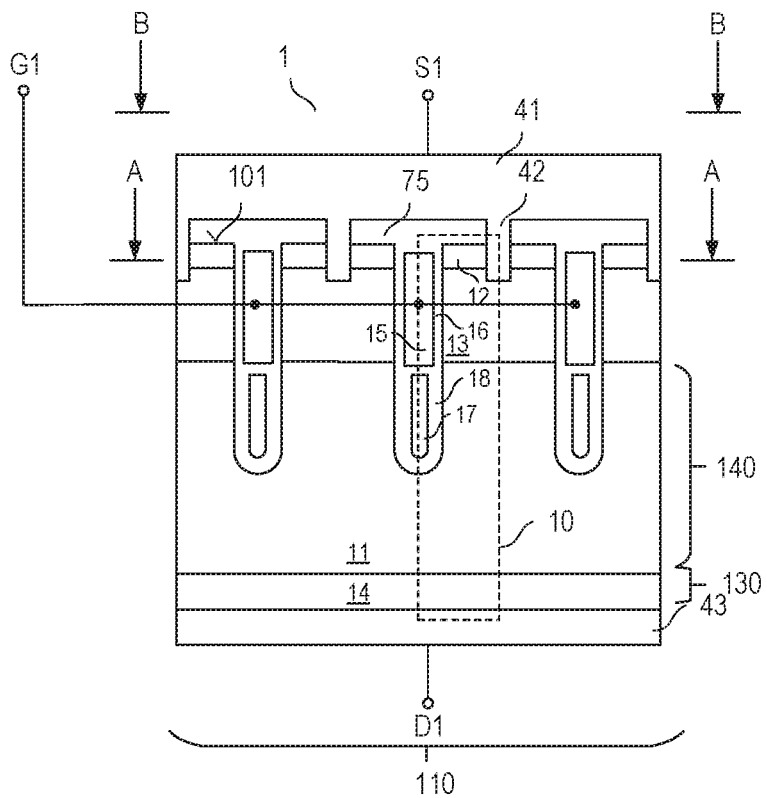
FIG. 8 illustrates another example of the first transistor device integrated in the first section of the semiconductor body.

FIG. 8 illustrates a modification of the first transistor device 1 shown in FIG. 7. The first transistor device 1 shown in FIG. 8 is different from the first transistor device 1 shown in FIG. 7 in that each transistor cell 10 additionally includes a field electrode 17 adjacent the drift region 11 and dielectrically insulated from the drift region 11 by a field electrode dielectric 18. The field electrodes 17 of the individual transistor cells 10 are either connected to the source node S1 or the gate node G1. Electrical connections between the field electrodes 17 and the source node S1 or the gate node G1, however, are not illustrated in FIG. 8.

FIGS. 7 and 8 show vertical cross sectional views of several transistor cells 10 of the first transistor device 1. In the horizontal plane A-A the transistor cells 10 can be implemented in various ways. Two examples are illustrated in FIGS. 9 and 10 and explained in the following.

Figure 9:
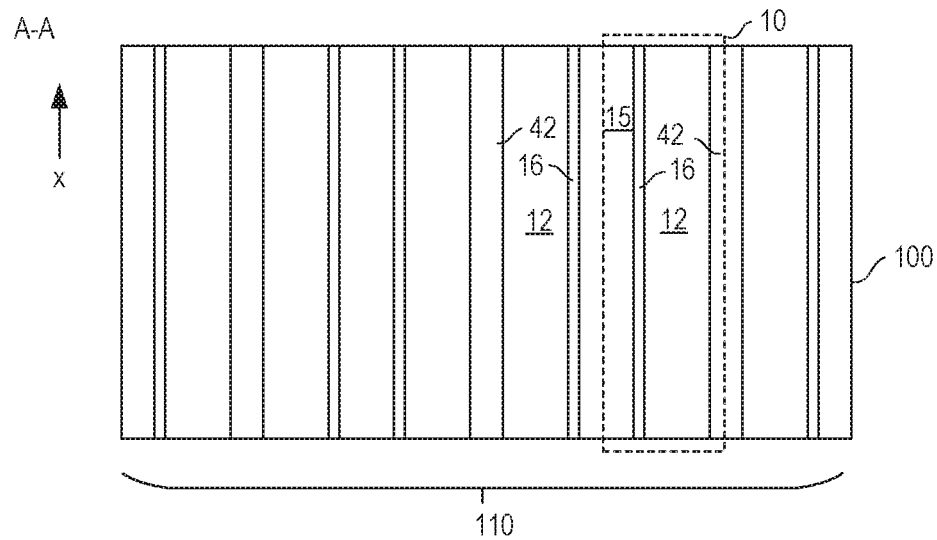
FIG. 9 shows a horizontal cross sectional of the first section of the semiconductor body according to one example.

In the example shown in FIG. 9, the transistor cells 10 are elongated transistor cells. In this example, the gate electrodes 15, the source regions 12 and the body regions 13 (which are out of view in FIG. 9) are elongated in a horizontal direction x of the semiconductor body 100.

Figure 10:
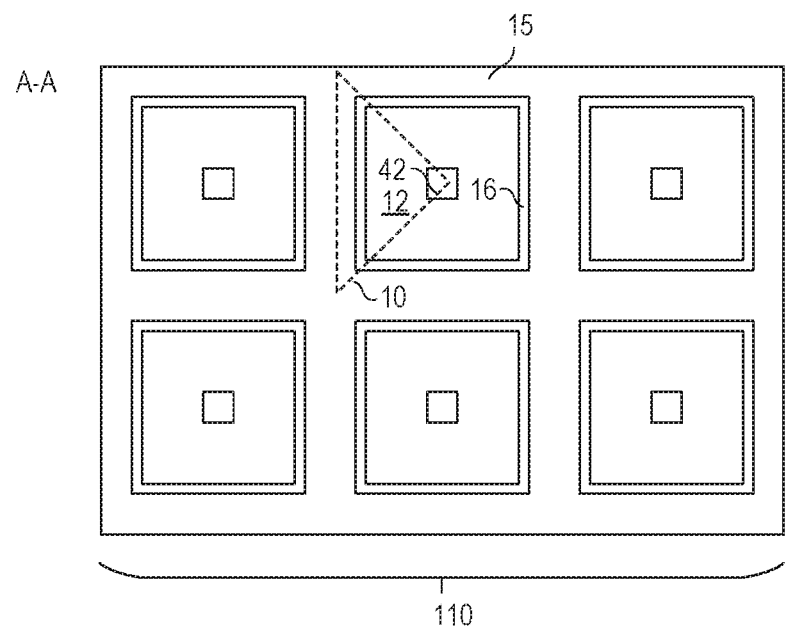
FIG. 10 shows a horizontal cross sectional of the first section according to another example.

In the example shown in FIG. 10, there is only one gate electrode 15 that has the shape of a grid. Source regions 12 and body regions 13 (which are out of view in FIG. 10) are arranged in openings of the grid defined by the gate electrode 15. Just for the purpose of illustration, the grid formed by the gate electrode 15 shown in FIG. 10 is a grid with rectangular openings. This, however, is only an example. The gate electrode 15 may be implemented with any other type of polygonal openings as well.

Figure 11:
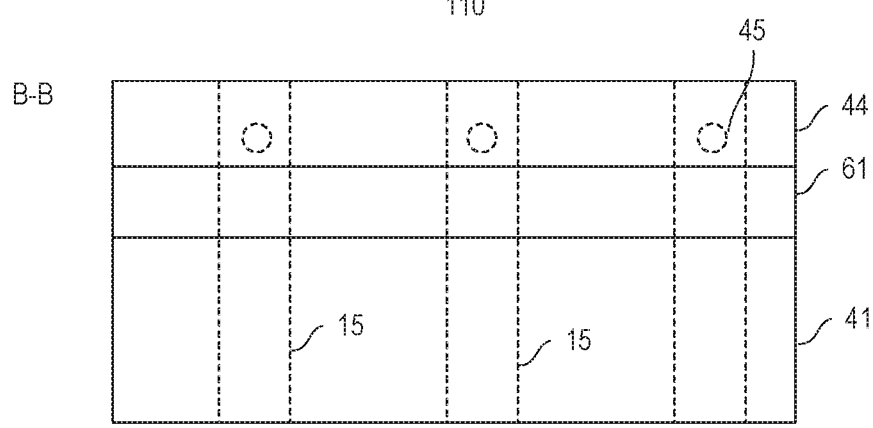
FIG. 11 shows a top view of the semiconductor body in a region where a source electrode and a gate runner of the first transistor device are arranged.

Referring to FIGS. 7 and 8, the gate electrodes 15 of the individual transistor cells 10 are electrically connected to the gate node G1 of the first transistor device 1. One example of how the gate electrodes 15 arranged in trenches of the semiconductor body 100 can be connected to the gate node G1 is illustrated in FIG. 11. FIG. 11 shows a top view of one section of the first region 110. More specifically, FIG. 11 shows one section of the source electrode 41, which is also illustrated in FIGS. 7 and 8, and a gate runner 44. The gate runner 44 is spaced apart from the source electrode 41 and arranged on top of the insulation layer 75 (see FIGS. 7 and 8). The gate runner 44 forms the gate node G1 or is electrically connected to the gate node G1 of the first transistor device 1. Further, electrically conducting vias 45 extend from the gate runner 44 through the insulation layer 75 down to the gate electrodes 15. The position of the gate electrodes 15 is illustrated in dashed lines in FIG. 11. The electrically conducting vias are out of view in FIG. 11, just their horizontal position is illustrated in FIG. 11. The gate electrodes 15 can be elongated gate electrodes as illustrated in FIG. 9. Alternatively, there can be one grid shaped gate electrode 15 as illustrated in FIG. 10. In this example, several "ends" of the grid shaped gate electrode 15 may extend to below the gate runner 44 and be connected to the gate runner 44 by the electrically conducting vias 45.

Figure 12B:
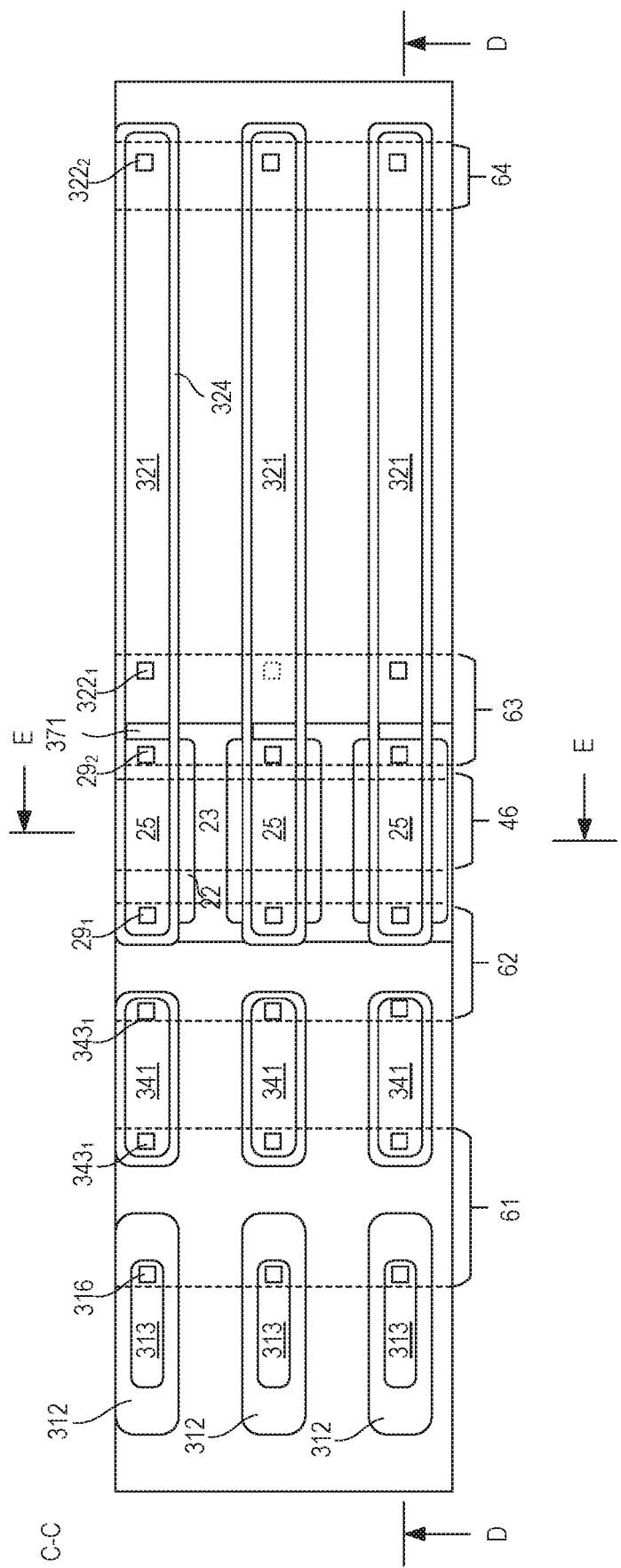
Figure 12C:
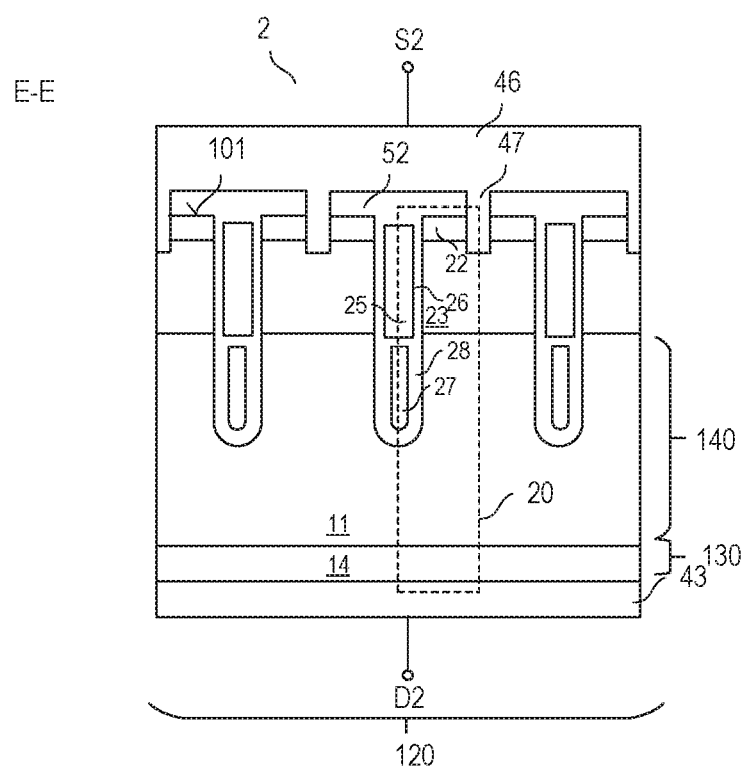

FIGS. 12A-12C illustrate one example for implementing the second transistor device 2, the first capacitor 31, the first resistor 32 and the optional second resistor 34 in the second region 120 of the semiconductor body 100. FIG. 12A shows a vertical cross sectional view of the second region 120 in one section plane D-D, FIG. 12B shows a horizontal cross sectional view of one section of the second region 120, and FIG. 12C shows a vertical cross sectional view of the second region 120 in another section plane E-E. In this example, the second transistor 2 includes a plurality of transistor cells that are connected in parallel, the first capacitor 31 includes a plurality of capacitor cells connected in parallel, the first resistor 32 includes a plurality of resistor cells, and the optional second resistor 34 includes a plurality of resistor cells. FIG. 12A shows a vertical cross sectional view of one transistor cell of the second transistor 2, one capacitor cell of the first capacitor 31, one resistor cell of the first resistor 32, and one resistor cell of the optional second resistor 34. FIG. 12B shows a top view of several transistor cells, several capacitor cells and several resistor cells, and FIG. 12C shows a vertical cross sectional view of several transistor cells 20 of the second transistor device 2. In the following, the transistor cells 20 of the second transistor device 2 are also referred to as second transistor cells, while the transistor cells 10 of the first transistor device 1 are also referred to as first transistor cells.

Referring to FIGS. 12A and 12C, each transistor cell of the second transistor device 2 includes a gate electrode 25 arranged in a trench of the semiconductor body 100 and dielectrically insulated from source and body regions 22, 23 by a gate dielectric 26. In the example shown in FIGS. 12A and 12C, the source regions 22 and the body regions 23 extend to the first surface 101 of the semiconductor body 100 and are electrically connected to a source electrode 46 via contact plugs 47. This source electrode 46 forms a source node S2 of the second transistor device 2 and is electrically connected to the source electrode 41 of the first transistor device 1. Such connection, however, is not illustrated in the drawings. The gate electrodes 25 of the transistor cells 20 are insulated from the source electrode 46 by an insulation layer 52.

A drift region 21 and a drain region 24 of the individual transistor cells 20 of the second transistor device 2 can be formed by the same semiconductor regions that form the drift region 11 and the drain region 14 of the transistor cells of the first transistor device 1. The semiconductor region forming the drift region 11 of the first transistor device 1 and the drift region 21 of the second transistor device 2 is labelled with reference character 140 in FIGS. 7, 8, 12A and 12C, and the semiconductor region forming the drain region 14 of the first transistor device and the drain region 24 of the second transistor device 2 is labelled with reference character 130 in FIGS. 7, 8, 12A and 12C. Further, the optional drain electrode 43 of the first transistor device formed on the second surface 102 of the semiconductor body 100 also forms the drain electrode of the second transistor device 2, so that this drain electrode 43 forms the common drain node D1/D2 of the first and second transistor device 1, 2.

Optionally, the transistor cells of the second transistor device 2 further include a field electrode 27 adjacent the drift region 21 and dielectrically insulated from the drift region 21 by a field electrode dielectric 28. This field electrode 27 may be connected to the source electrode 45 of the second transistor device 2. However, a connection between the field electrodes 27 and the source electrode 45 is not shown in FIGS. 12A and 12C. Further, the gate electrodes 25 and field electrodes 27 may be implemented in the same trenches.

Referring to FIG. 12A, each capacitor cell of the first capacitor 31 includes a first capacitor electrode 311 arranged in a trench of the semiconductor body 100 and a capacitor dielectric 312 dielectrically insulating the first capacitor electrode 311 from the semiconductor body 100. A second capacitor electrode of the capacitor cell is formed by the common drain electrode 43 and those regions 314, 315 of the semiconductor body 100 arranged between the common drain electrode 43 and the capacitor dielectric 312. According to one example, the semiconductor region 314 adjoining the capacitor dielectric 312 is formed by the semiconductor region 140 that also forms the drift regions 14, 24 of the first and second transistor device 1, 2, and the semiconductor region 315 is formed by the semiconductor region 130 that forms the drain regions 14, 24 of the first and second transistor device 1, 2.

According to one example, the capacitor dielectric 312 is formed by the same process that forms the optional field electrode dielectric 18 in the transistor cells 10 of the first transistor device 1 and the optional field electrode dielectric 28 in the transistor cells 20 of the second transistor device 2. Further, the capacitor electrode 311 can be formed by the same process that forms the field electrodes 17 in the transistor cells 10 of the first transistor device 1 and the optional field electrodes 27 in the transistor cells 20 of the second transistor device 2. The capacitor electrodes 311 of the individual capacitor cells are electrically connected with each other by a first metallization 61 formed on top of the first surface 101 of the semiconductor body 100. This first metallization 61 is insulated from the semiconductor body 100 by an insulation layer 71 and electrically connected to each capacitor electrode 311 by respective via 316 extending from the first metallization layer 61 down to the capacitor electrode 311.

In the example illustrated in FIG. 12A, the electrically conducting via includes a first section 313 extending from the capacitor electrode 311 to the surface 101 of the semiconductor body 100, and a second section 316 extending from the first section 313 through the insulation layer 71 to the first metallization layer 61. Alternatively, as illustrated in dashed lines in FIG. 12A, the capacitor electrode 311 extends to the first surface 101, where it is connected to the second via section 316, and the first via section 313 is omitted. According to another example (not shown), the first via section 313 is omitted and the second via section 316 extends from the metallization 61 through the insulation layer 71 and the dielectric 312 down to the capacitor electrode 311. The first metallization layer 61 that connects the capacitor electrodes 311 of the several capacitor cells with each other is further connected to the gate electrodes 25 of the transistor cells 20 of the second transistor device 2 in order to connect the first capacitor 31 to the gate node G2 (which is formed by the gate electrodes 25) of the second transistor device 2. In the example illustrated in FIGS. 12A and 12B, the first capacitor 31 is connected to the gate node G2 of the second transistor device 2 via the second resistor 34 and a second metallization 62. This second resistor 34, however, is optional and can be omitted. When the second resistor cell 34 is omitted, the first metallization layer 61 is directly connected to the gate electrodes 25 of the individual transistor cells 20.

In the example illustrated in FIGS. 12A and 12B, the second resistor 34 includes a conductor 341 arranged in a trench of the semiconductor body 100. This conductor 341 is electrically connected to the first metallization 61 at one horizontal end and to the second metallization 62 at a second horizontal end. A first electrically conducting via $343_1$ connects the first end of the conductor 341 to the first metallization 61, and a second electrically conducting via $343_2$ connects the second end of the conductor 341 to the second metallization 62. The second metallization 62 is insulated from the semiconductor body 100 by a second insulation layer 72, wherein the second via $343_2$ extends through this second insulation layer 72. Further, the second metallization 62 is connected to the gate electrodes 25 of the transistor cells 10 by electrically conducting vias $29_1$.

The conductor 341 of the second resistor 34 may include a doped polycrystalline semiconductor material such as, for example, polysilicon. The conductor 341 is electrically insulated from the semiconductor body 100 by a dielectric layer 342. According to one example, the conductor 341 is formed by the same process that forms the gate electrodes 15 of the transistor cells 10 of the first transistor device 1 and the gate electrodes 25 of the transistor cells 20 of the second transistor device 2. Further, the dielectric layer 342 insulating the conductor 341 from the semiconductor body 100 can be formed by the same process that forms the gate dielectrics 16, 26 of the transistor cells 10, 20 of the first and second transistor device 1, 2.

Referring to FIGS. 12A and 12B, the resistor cells of the first resistor 32 can be implemented in the same fashion as the resistor cells of the second resistor 34. In the example illustrated in FIGS. 12A and 12B, conductors 321 of resistor cells of the first resistor 32 are arranged in the same trenches as the gate electrodes 25 of the transistor cells 20 of the second transistor device 2. The conductors are insulated from the semiconductor body 100 by insulation layers 324. Further insulation layers 65 electrically insulate the gate electrodes 25 from the conductors 321. The conductors 321 of the second resistor 32 are electrically connected to the gate electrodes 25 of the second transistor cells 20 by a third metallization layer 63 arranged on top of the semiconductor body 100 and electrically insulated from the semiconductor body 100 by an insulation layer 73. Electrically conducting first vias 292 connect the third metallization layer 63 to the gate electrodes 25, and electrically connecting second vias $322_1$ connect the third metallization layer 63 to the conductors 321. These second vias $322_1$ connect the conductors 321 to the third metallization layer 63 at a first horizontal end of the conductors 321. At a second horizontal end the conductors 321 are connected to a fourth metallization layer 64 that is arranged on the top of the semiconductor body 100 and electrically insulated from the semiconductor body 100 by a further insulation layer 74. The conductors 321 are connected to the fourth metallization layer 64 by third vias $322_2$. The fourth metallization layer 64 is electrically connected to the further circuit node 33, which is schematically illustrated in FIG. 12A.

A resistance of the first resistor 32 can be adjusted by suitably adjusting lengths of the conductors 321, more specifically, by a distance between the positions at which the conductors 321 are connected to the third and fourth metallizations 63, 64. Further, the resistance can be adjusted by suitably selecting the material of the conductors 321. According to one example, the conductors 321 include a doped polycrystalline semiconductor material such as, for example, polysilicon. According to one example, each of the conductors 321 is connected between the third and fourth metallizations 63, 64. According to another example, one or more of the conductors 321 are not connected to at least one of these metallizations 63, 64 in order to adjust the electrical resistance. Equivalently, the resistance of the optional second resistor 34 can be adjusted by the length of the conductors 341, the choice of the material and the number of conductors connected between the capacitor 31 and the gate electrodes 25 of the second transistor cells 20.

In the examples illustrated in FIGS. 12A and 12B, the conductors 321, 341 of the first resistor 32 and the optional second resistor 34, which are also referred to as upper conductors 321, 341 in the following, can be of the same type as the gate electrodes 15 (not shown in FIGS. 12A and 12B) and 25 of the transistor cells 10 (not shown) and 20 and can be formed by the same process that forms these gate electrodes 15, 25. This, however, is only an example. According to another example, conductors of the first resistor 32 and the optional second resistor 34 are formed by conductors that are of the same type and formed by the same process as the field electrodes 17 (not shown in FIGS. 12A and 12B) and 27 of the transistor cells 10, 20. In FIG. 12A, conductors of this type are shown and labelled with reference characters 327, 347. These conductors 327, 347, which are referred to as lower conductors in the following, are disposed below and in the same trenches as the upper conductors 321, 341. Taking into account the upper conductors 321, 341 and the lower conductors 327, 347 there are several ways to implement the first resistor 32 and the optional second resistor 34. (a) The lower conductors 327, 347 are omitted so that the first resistor 32 and the optional second resistor 34 are formed by the upper conductors 321, 341 as explained above. (b) The upper conductors 321, 341 are omitted so that the first resistor 32 and the optional second resistor 34 are formed by the lower conductors 327, 347 as explained above. In this case, the vias $343_1$, $343_2$, $322_1$, $322_2$ illustrated in FIG. 12A extend down to the lower conductors 327, 347. (c) Both the upper conductors 321, 341 and the lower conductors 327, 347 form the first resistor 32 and the optional second resistor 34.

Figure 13:
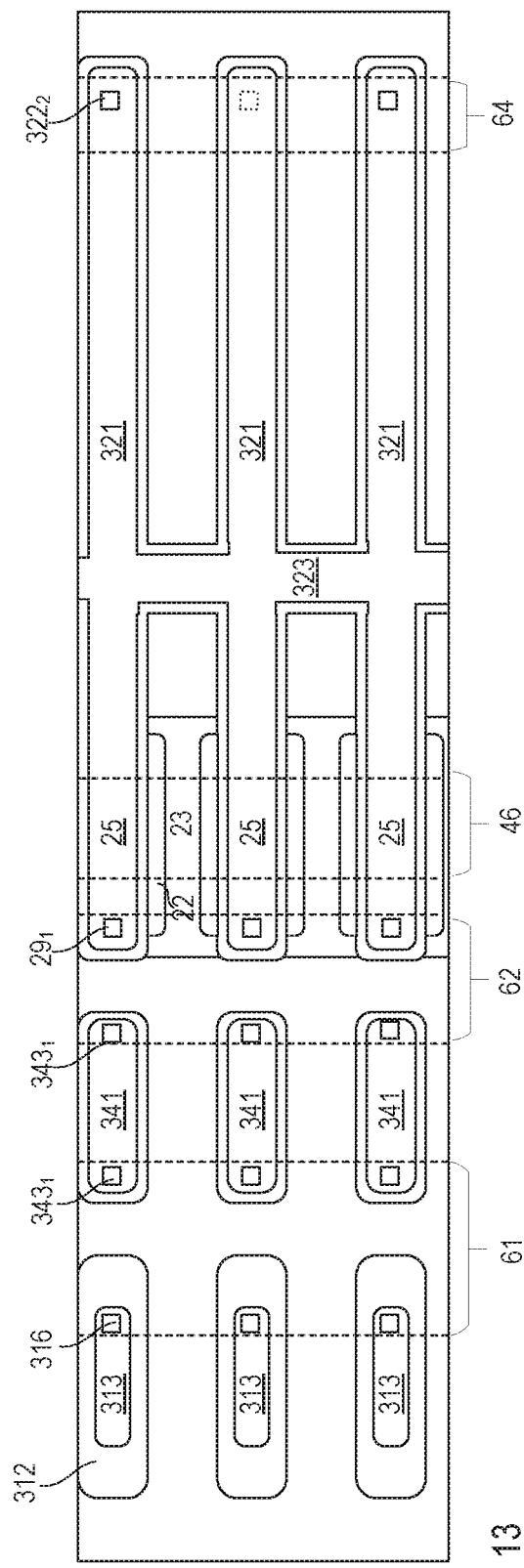
FIG. 13 illustrates a modification of the clamping circuit shown in FIGS. 12A and 12B.

FIG. 13 shows a modification of the arrangement illustrated in FIG. 12B. In the example shown in FIG. 13, the conductors 321 of the second resistor 32 are electrically connected with each other by a connection electrode 323 that is arranged in a trench extending perpendicular to the trenches in which the conductors 321 are arranged. Further, the conductors 321 are not insulated from the gate electrodes 25 so that the third metallization 63 shown in FIGS. 12A and 12B can be omitted. In this example, the electrical resistance between the gate electrodes 25 of the second transistor device 2 and the further circuit node 33 connected to the fourth metallization can be adjusted by suitably selecting the number of vias $322_2$ between the fourth metallization 64 and the conductor 321. In this example, the resistance of the second resistor can easily be varied by varying the number of vias $322_2$. The connection electrode 323, however, requires space.

FIGS. 14A and 14B show another example for implementing the first transistor device 1 and the clamping circuit 2, 3 in one semiconductor body 100. FIG. 14A shows a vertical cross sectional view of the semiconductor body 100 in a section plane G-G that cuts through a section of the first region 110 and a section of the second region 120, and FIG. 14B shows a corresponding horizontal cross sectional view in a section plane F-F.

In the example shown in FIGS. 14A and 14B, the capacitor 31 is implemented in the way explained with reference to FIG. 12A. That is, the capacitor 31 includes a first capacitor electrode 311 arranged in a trench, a capacitor dielectric 312 adjoining the first capacitor electrode 311, and a second capacitor electrode formed by the common drain electrode 43 and regions 314, 315 of the semiconductor body 100 arranged between the common drain electrode 43 and the capacitor dielectric 312. These regions 314, 315 can be part of the same semiconductor regions 140, 130 that form the drain regions 14, 24 and the drift regions 11, 21 of the transistor cells of the first and second transistor device 1, 2. In FIGS. 14A and 14B only one trench with a capacitor electrode 311 is shown. This, however, is only an example. The capacitor 31 may include several parallel trenches, wherein each trench includes a capacitor electrode 311 of the type shown in FIGS. 14A and 14B, and wherein these capacitor electrodes are connected with each other.

Referring to FIG. 14B, the at least one trench with the capacitor electrode 311 may run essentially perpendicular to a plurality of trenches (from which two are shown in FIG. 14B) that each include the gate electrode 25 and the field electrode 27 of one transistor cell 20 of the second transistor device 2 (i.e., one second transistor cell) and the gate electrode 15 and the field electrode 17 of one transistor cell 10 of the first transistor device 1 (i.e., one first transistor cell). In each of these trenches, the gate electrode 25 of the second transistor cell is arranged in that section of the trench that face the trench with the capacitor electrode 311. The at least one capacitor electrode 311 is connected to the gate electrodes 25 of the second transistor cell by the first metallization 61 explained before, wherein the first metallization 61 is connected to the capacitor electrode 311 by vias 316. Further, the first metallization 61 is connected to the gate electrodes 25 by second vias 29 that are arranged in the region of first ends of the trenches that accommodate the gate electrodes 15, 25.

Implementing the trench with the capacitor electrode 311 such that it is perpendicular to the trenches of the transistor cells 10, 20 is only an example. The trench with the capacitor electrode can be oriented relative to the trenches of the transistor cells 10, 20 in any other way as well.

Referring to FIGS. 14A and 14B, at second ends opposite the first ends of the trenches the gate electrodes 15 of the first transistor cells are connected to the gate runner 44 by vias 45 in the way explained with reference to FIG. 11. Further, a field electrode 17 of a first transistor device 1 and a field electrode 27 of a second transistor cell arranged in the same trench are formed by a common electrode dielectrically insulated from the semiconductor body 100 by the field electrode dielectrics 18, 28. Between the gate electrodes 15, 25 of the first and second transistor cell a source via extends from a common source electrode 41, 46 down to the electrode forming the field electrodes 17, 27. This source via 48 is dielectrically insulated from the gate electrodes 15, 25. The common source electrode 41, 46 is connected to the source regions 12, 22 and the body regions 13, 23 of the first and second transistor cells.

Referring to FIG. 14B, the first resistor 32 includes conductor 321 arranged in a trench that extends from below the first metallization 61 to the gate runner 44 and is connected to the gate runner 44 by a via $322_1$ and the first metallization 61 by another via $322_2$. In this way, the first resistor 32 is connected between the first capacitor 31 and the gate node G1 of the first transistor device 1. Within the trench, the conductor 321 can be implemented as explained with reference to FIGS. 12A and 12B. In the example shown in FIG. 14, the first resistor 32 includes only one conductor 321 arranged in one trench. This, however, is only an example. According to another example, the resistor 32 includes several conductors arranged in several trenches and connected in parallel. The resistance of the first resistor 32 can be adjusted by the number of conductors 321 connected in parallel, the material of the at least one conductor 321, but also a length of the at least one conductor 321, that is, a distance between the first metallization 61 and the gate runner 44.

Figure 15:
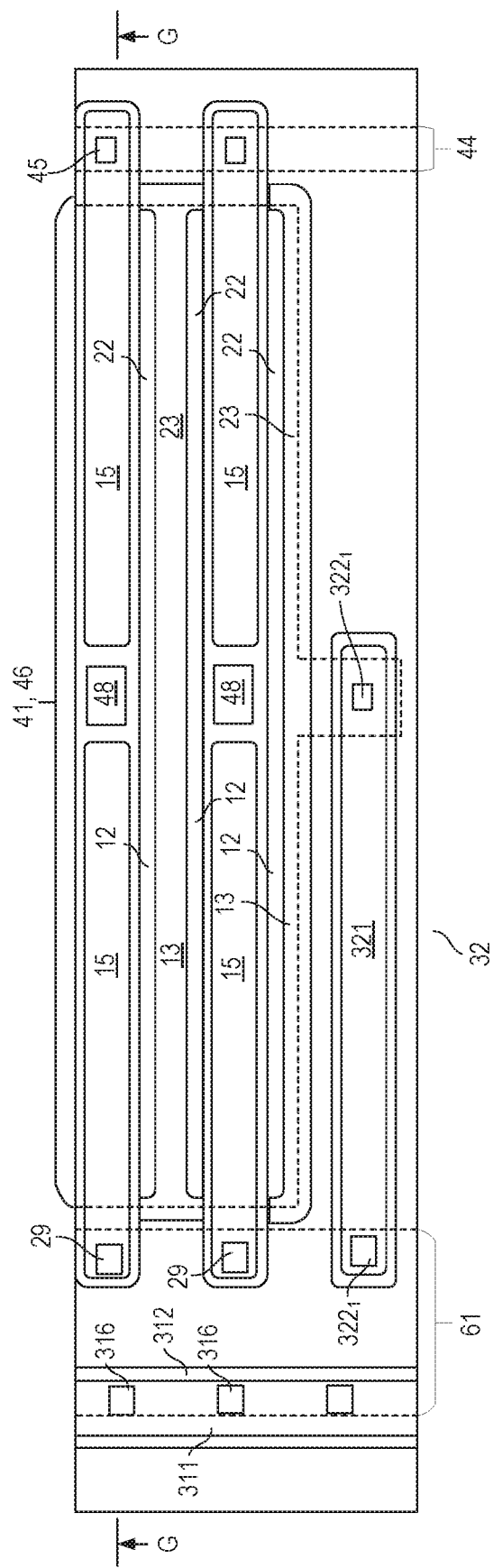
FIG. 15 shows a modification of the arrangement shown in FIGS. 14A-14B.

FIG. 15 shows a modification of the first resistor 32 shown in FIG. 14B. In the example shown in FIG. 15, the common source electrode 41, 46, the position of which is illustrated in dashed lines in FIG. 15, overlaps the conductor 321 and the conductor 321 is connected to the common source electrode 41, 46 by via $322_1$. In this way, the first resistor 32 is connected between the capacitor 31 and the common source node S1, S2. In the example shown in FIG. 15, the first resistor 32 includes only one conductor 321 arranged in one trench. This, however, is only an example. According to another example, the resistor 32 includes several conductors arranged in several trenches and connected in parallel. The resistance of the first resistor 32 can be adjusted by the number of conductors 321 connected in parallel, the material of the at least one conductor 321, but also a length of the at least one conductor 321, that is, a distance between the first metallization 61 and the position where the at least one conductor 321 is connected to the source metallization 41, 46.

The second resistor is omitted in the examples shown in FIGS. 14A-14B and 15. Nevertheless, a second resistor corresponding to the second resistor 34 explained before could also be provided in these examples.

Figure 16:
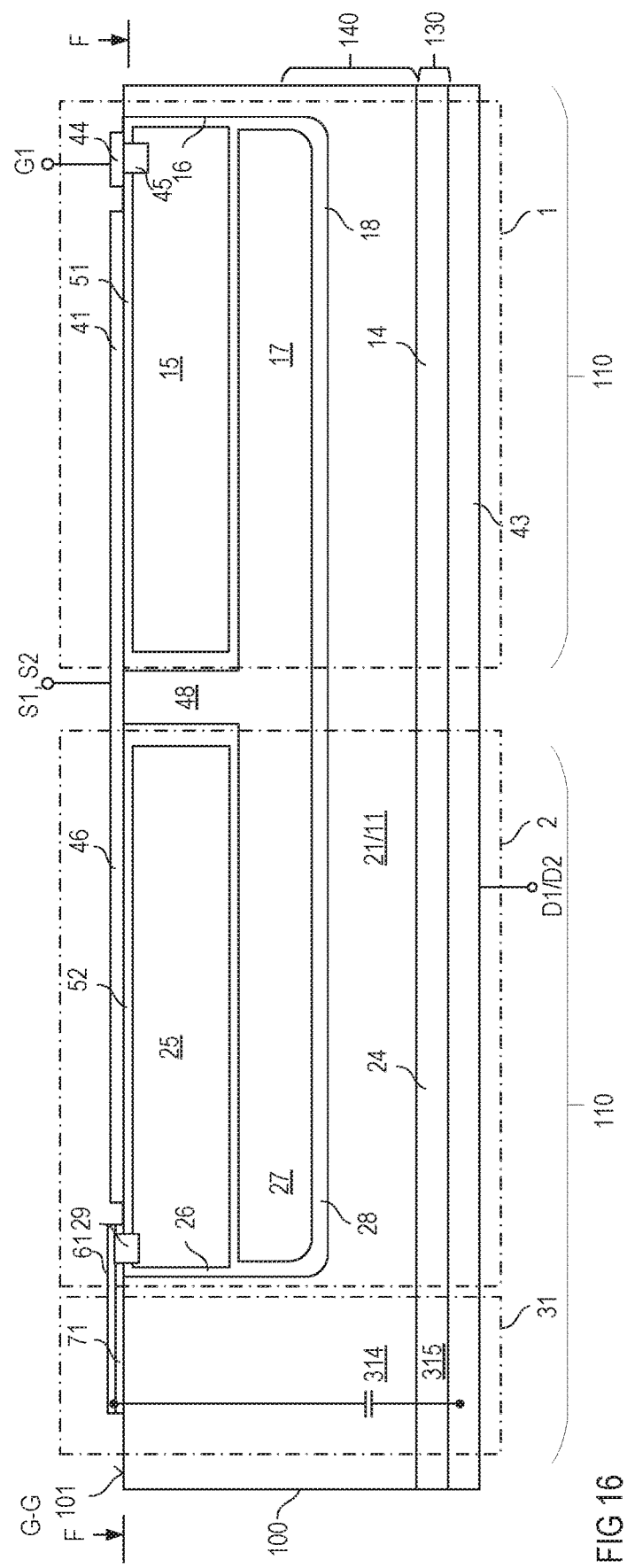
FIG. 16 shows another modification of the arrangement shown in FIGS. 14A-14B.

FIG. 16 shows another modification of the arrangement shown in FIGS. 14A-14B. In this example, the first capacitor electrode of the capacitor 31 is formed by the fir metallization that is formed on top of the first surface 101 of the semiconductor body 100, and the capacitor dielectric is formed by the insulation layer 71 that separates the fir metallization layer 61 from the semiconductor body 100. The second capacitor electrode is formed by the drain electrode 43 and the semiconductor regions 315, 314 that correspond to the drain and drift regions 14, 24, 11, 21 of the transistor devices. Thus, in this example a trench electrode corresponding to the trench electrode 311 shown in FIG. 14A and a corresponding dielectric (312 in FIG. 14A) are omitted.

Figure 17:
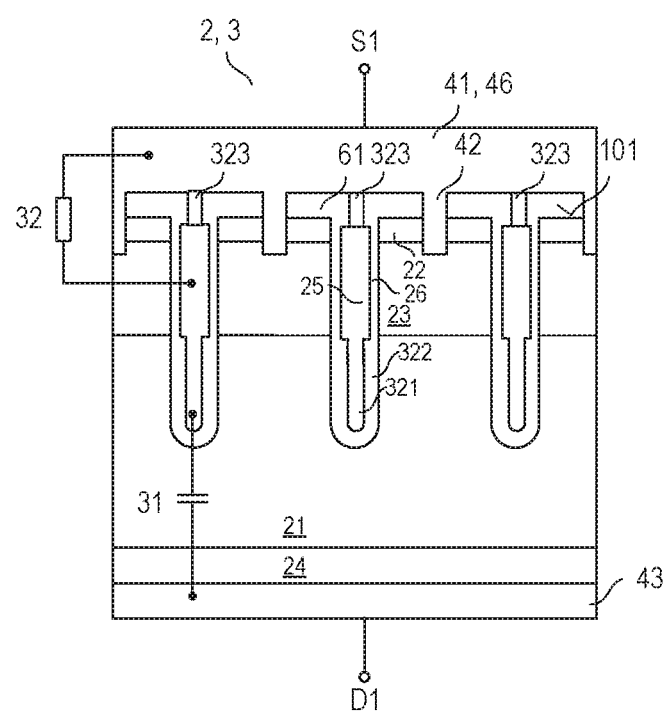
FIG. 17 illustrates a clamping circuit according to another example.

FIG. 17 illustrates another example for implementing the second transistor device 2 and the drive circuit 3 in the second region 120 of the semiconductor body 100. In this example, the second transistor device 2 includes a plurality of transistor cells 20. These transistor cells are similar to the transistor cells illustrated in FIG. 12C and are different from these transistor cells 20 illustrated in FIG. 12C in that the gate electrodes 25 are connected to the same source electrode layer 41 as the transistor cells of the first transistor device 1, wherein the gate electrodes 25 of the second transistor cells 20 are connected to the source electrode 41 through resistive vias 323 which together form the first resistor 32. The circuit symbol of the first resistor 32 is also illustrated in FIG. 17. A resistance of the first resistor 32 can be adjusted by at least one of the following parameters: (a) The material of the resistive vias 323. According to one example, these resistive vias 323 include a metal or a doped polycrystalline semiconductor material such as, for example, polysilicon. (b) A cross sectional area of the vias 323. (c) The number of vias. According to one example, the gate electrodes 25 are elongated in a direction perpendicular to the drawing plane shown in FIG. 17 and each of these gate electrodes 25 is connected to the common source electrode 41, 46 by several vias 323 that are spaced apart from each other in the longitudinal direction of the respective gate electrode 25. In this case, the resistance of the first resistor 32 can be adjusted by suitably selecting the number of vias 323.

The transistor cells 20 illustrated in FIG. 17 are further different from the transistor cells shown in FIG. 12C in that capacitor cells of the first capacitor 31 are arranged in the same trenches as the gate electrodes 25 below the gate electrodes 25. Each of these capacitor cells includes a capacitor electrode 321 that adjoins the respective gate electrode 25 and is dielectrically insulated from the drift region 21 by a dielectric layer 322. This dielectric layer 322 forms the capacitor dielectric.

Although the present disclosure is not so limited, the following numbered examples demonstrate one or more aspects of the disclosure.

Example 1

An electronic circuit including a first transistor device and a clamping circuit, wherein the first transistor device includes a control node and a load path between a first load node and a second load node, wherein the clamping circuit includes a second transistor device and a drive circuit, wherein the second transistor device includes a control node and a load path connected in parallel with the load path of the first transistor device, and wherein the drive circuit includes a capacitor coupled between the second load node of the first transistor device, and a first resistor coupled between the control node of the second transistor device and a further circuit node.

Example 2

The electronic circuit of example 1, wherein the further circuit node is the first load node of the first transistor device.

Example 3

The electronic circuit of any combination of examples 1 to 2, wherein the further circuit node is the control node of the first transistor device.

Example 4

The electronic circuit of any combination of examples 1 to 3, further including: a second resistor connected in series with the capacitor.

Example 5

The electronic circuit of any combination of examples 1 to 4, wherein the first transistor device and the clamping circuit are integrated in a common semiconductor body having a first surface.

Example 6

The electronic circuit of any combination of examples 1 to 5, wherein the first transistor device includes a plurality of transistor cells, each including: a drift region; a source region; a body region separating the drift region from the source region; a drain region; and a gate electrode dielectrically insulated from the body region by a gate dielectric.

Example 7

The electronic circuit of any combination of examples 1 to 6, wherein the gate electrode is arranged in a first trench extending from the first surface into the semiconductor body.

Example 8

The electronic circuit of any combination of examples 1 to 7, wherein each transistor cell further includes: a field electrode dielectrically insulated from the drift region and dielectrically insulated from the gate electrode.

Example 9

The electronic circuit of any combination of examples 1 to 8, wherein the capacitor includes: a first electrode arranged in a second trench extending from the first surface into the semiconductor body; a dielectric layer dielectrically insulating the first electrode from the semiconductor body; a second electrode; and a section of the semiconductor body arranged between the dielectric layer and the second electrode.

Example 10

The electronic circuit of any combination of examples 1 to 9, wherein the second electrode is connected to the drain region of each of the plurality of transistor cells of the first transistor device.

Example 11

The electronic circuit of any combination of examples 1 to 10, wherein the first resistor includes a conductor arranged in a third trench extending from the first surface into the semiconductor body.

Example 12

The electronic circuit of any combination of examples 1 to 11, wherein the second transistor device includes at least one transistor cell including: a drift region; a source region; a body region separating the drift region from the body region; a drain region; and a gate electrode dielectrically insulated from the body region by a gate dielectric.

Example 13

The electronic circuit of any combination of examples 1 to 12, wherein the drift region of the at least one transistor cell of the second transistor device and the drift region of each of the plurality of transistor cells of the first transistor device are formed by the same semiconductor layer, and wherein the drain region of the at least one transistor cell of the second transistor device and the drain region of each of the plurality of transistor cells of the first transistor device are formed by the same semiconductor layer.

Example 14

The electronic circuit of any combination of examples 1 to 13, wherein the second transistor device includes at least one transistor cell having a drift region, a source region, a body region separating the drift region from the source region, a drain region, a gate electrode dielectrically insulated from the body region by a gate dielectric, and a source electrode connected to the source region, wherein the capacitor includes a capacitor electrode electrically connected to the gate electrode and dielectrically insulated from the drift region of the at least one transistor cell of the second transistor device, and wherein the first resistor is connected between the source electrode and the gate electrode of the at least one transistor cell of the second transistor device.

Example 15

The electronic circuit of any combination of examples 1 to 14, wherein the gate electrode of the at least one transistor cell of the second transistor device and the electrode of the capacitor are arranged in a common trench extending from the first surface into the semiconductor body.

While the invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

The invention claimed is:

1. An electronic circuit comprising a first transistor device and a clamping circuit,
wherein the first transistor device comprises a control node and a load path between a first load node and a second load node,
wherein the clamping circuit comprises a second transistor device and a drive circuit,
wherein the second transistor device comprises a control node and a load path connected in parallel with the load path of the first transistor device,
wherein the drive circuit comprises a capacitor and a first resistor,
wherein the capacitor is coupled between the second load node of the first transistor device and the first resistor,
wherein the first resistor is coupled between the control node of the second transistor device and a further circuit node,
wherein the second transistor device is configured to clamp a load path voltage across the load path of the first transistor device when the load path voltage reaches a clamping level,
wherein the clamping level is dependent on a threshold voltage of the second transistor device and a voltage divider ratio of a capacitor voltage divider formed by the first capacitor and an internal capacitance of the second transistor device.

2. The electronic circuit of claim 1, wherein the further circuit node is the first load node of the first transistor device.

3. The electronic circuit of claim 1, wherein the further circuit node is the control node of the first transistor device.

4. The electronic circuit of claim 1, further comprising:
a second resistor connected in series with the capacitor.

5. The electronic circuit of claim 1, wherein the first transistor device and the clamping circuit are integrated in a common semiconductor body having a first surface.

6. The electronic circuit of claim 5, wherein the first transistor device comprises a plurality of transistor cells, each comprising:
a drift region;
a source region;
a body region separating the drift region from the source region;
a drain region; and
a gate electrode dielectrically insulated from the body region by a gate dielectric.

7. The electronic circuit of claim 6, wherein the gate electrode is arranged in a first trench extending from the first surface into the semiconductor body.

8. The electronic circuit of claim 7, wherein each transistor cell further comprises:
a field electrode dielectrically insulated from the drift region and dielectrically insulated from the gate electrode.

9. The electronic circuit of claim 7, wherein the capacitor comprises:
a first electrode arranged in a second trench extending from the first surface into the semiconductor body;
a dielectric layer dielectrically insulating the first electrode from the semiconductor body;
a second electrode; and
a section of the semiconductor body arranged between the dielectric layer and the second electrode.

10. The electronic circuit of claim 9,
wherein the second electrode is connected to the drain region of each of the plurality of transistor cells of the first transistor device.

11. The electronic circuit of claim 5, wherein the first resistor comprises a conductor arranged in a third trench extending from the first surface into the semiconductor body.

12. The electronic circuit of claim 6, wherein the second transistor device comprises at least one transistor cell comprising:
a drift region;
a source region;
a body region separating the drift region from the source region;
a drain region; and
a gate electrode dielectrically insulated from the body region by a gate dielectric.

13. The electronic circuit of claim 12,
wherein the gate electrode of a first of the at least one transistor cell of the second transistor device is arranged in a first trench extending from the first surface into the semiconductor body,
wherein the capacitor comprises a first electrode arranged in a second trench extending from the first surface into the semiconductor body, and
wherein the second trench runs perpendicular to the first trench.

14. The electronic circuit of claim 13,
wherein the first electrode is electrically connected to the gate electrode by a metallization arranged on the first surface of the semiconductor body.

15. The electronic circuit of claim 13,
wherein the at least one transistor cell of the second transistor device comprises additional transistor cells in addition to the first transistor cell,
wherein the gate electrode of each of the additional transistor cells is arranged in an additional trench extending from the first surface into the semiconductor body, and
wherein the additional trenches run parallel to the first trench and perpendicular to the second trench.

16. The electronic circuit of claim 15,
wherein the gate electrodes of each of the plurality of transistor cells of the first transistor device are arranged in the first and the additional trenches in which the gate electrodes of the second transistor are arranged.

17. The electronic circuit of claim 16, further comprising:
a common field electrode disposed in the first trench,
wherein the common field electrode is dielectrically insulated from the drift region of the first and the second transistor devices, from the gate electrode of the first cell of the second transistor device, and from the gate electrode of the cell of the first transistor device that is arranged in the first trench.

18. The electronic circuit of claim 12,
wherein the drift region of the at least one transistor cell of the second transistor device and the drift region of each of the plurality of transistor cells of the first transistor device are formed by the same semiconductor layer, and
wherein the drain region of the at least one transistor cell of the second transistor device and the drain region of each of the plurality of transistor cells of the first transistor device are formed by the same semiconductor layer.

19. The electronic circuit of claim 5,
wherein the second transistor device comprises at least one transistor cell having a drift region, a source region, a body region separating the drift region from the source region, a drain region, a gate electrode dielectrically insulated from the body region by a gate dielectric, and a source electrode connected to the source region, wherein the capacitor comprises a capacitor electrode electrically connected to the gate electrode and dielectrically insulated from the drift region of the at least one transistor cell of the second transistor device, and wherein the first resistor is connected between the source electrode and the gate electrode of the at least one transistor cell of the second transistor device.

20. The electronic circuit of claim 19, wherein the gate electrode of the at least one transistor cell of the second transistor device and the capacitor electrode are arranged in a common trench extending from the first surface into the semiconductor body.

21. The electronic circuit of claim 1, wherein the second transistor device is configured to switch on when a drive voltage of the second transistor device is greater than a threshold voltage of the second transistor device, and wherein the drive voltage is given by:

$$V_{GS2} = \frac{C31}{C31 + C_{GS3}} \cdot V_{DS},$$

where C31 is the capacitance of the first capacitor, $C_{GS2}$ is the internal capacitance of the second transistor device, and $V_{DS}$ is the load path voltage.

* * * * *